(12) United States Patent
Park et al.

(10) Patent No.: US 8,294,471 B2
(45) Date of Patent: Oct. 23, 2012

(54) ULTRA-HIGH FREQUENCY PARTIAL DISCHARGE ARRAY SENSOR APPARATUS FOR HIGH-VOLTAGE POWER APPARATUS

(75) Inventors: Ki-Jun Park, Daejeon (KR); Hyung-Jun Ju, Daejeon (KR); Sun-Geun Goo, Daejeon (KR); Jin-Yul Yoon, Daejeon (KR); Ki-Seon Han, Daejeon (KR)

(73) Assignee: Korea Electric Power Corporation, Gangnam-gu (KR)

( * ) Notice: Subject to any disclaimer, the term of this patent is extended or adjusted under 35 U.S.C. 154(b) by 357 days.

(21) Appl. No.: 12/567,042

(22) Filed: Sep. 25, 2009

(65) Prior Publication Data

US 2010/0123464 A1    May 20, 2010

(30) Foreign Application Priority Data

Nov. 14, 2008  (KR) .................. 10-2008-0113592

(51) Int. Cl.
*H02H 5/04* (2006.01)
*G01R 31/00* (2006.01)

(52) U.S. Cl. ............... 324/536; 361/23; 324/500
(58) Field of Classification Search .......... 324/500, 324/536, 530; 340/635; 361/23
See application file for complete search history.

(56) References Cited

U.S. PATENT DOCUMENTS

| | | | | |
|---|---|---|---|---|
| 2,421,578 | A | * 6/1947 | Reason | ........................ 73/105 |
| 2003/0214307 | A1* | 11/2003 | Kang et al. | .................. 324/536 |
| 2006/0038573 | A1* | 2/2006 | Sarkozi et al. | ............... 324/536 |

FOREIGN PATENT DOCUMENTS

| | | |
|---|---|---|
| JP | 64-74466 A | 3/1989 |
| JP | 05-304719 A | 11/1993 |
| JP | 2003-84027 A | 3/2003 |
| KR | 1991-0001395 A | 1/1991 |

OTHER PUBLICATIONS

Korean Registration Decision, issued in Korean Patent Application No. 10-2008-0113592, dated Feb. 28, 2011.

* cited by examiner

*Primary Examiner* — Melissa Koval
*Assistant Examiner* — Farhana Hoque
(74) *Attorney, Agent, or Firm* — McDermott Will & Emery LLP

(57) ABSTRACT

The ultra-high frequency partial discharge array sensor apparatus for a high-voltage power apparatus includes: a sensing unit which detects an electromagnetic wave partial discharge signal generated due to an internal defect of a high-voltage power apparatus and includes a plurality of sensors installed to detect information related to the position where the defect occurs; an anti-surge filter unit which prevents a surge input from the sensing unit; a signal delay time adjusting unit which equally adjusts delay times of signals input from the anti-surge filter unit; a signal switching unit which selectively transmits or blocks signals input from the signal delay time adjusting unit; a connector unit which connects a signal transmitted from the signal switching unit to the outside; and a sensor body which has a receiving space.

8 Claims, 4 Drawing Sheets

ULTRA-HIGH FREQUENCY PARTIAL DISCHARGE ARRAY SENSOR APPARATUS FOR HIGH-VOLTAGE POWER APPARATUS

CROSS-REFERENCE TO RELATED APPLICATION

This application claims priority to and the benefit of Korean Patent Application No. 2008-0113592, filed on Nov. 14, 2008, the disclosure of which is incorporated herein by reference in its entirety.

BACKGROUND

1. Field of the Invention

The present invention relates to an ultra-high frequency partial discharge array sensor apparatus, and more particularly, to an ultra-high frequency partial discharge array sensor apparatus for detecting an electromagnetic wave partial discharge signal generated due to an internal defect of a high-voltage power apparatus such as a gas insulated switchgear, a power transformer, a reactor, or a high voltage rotating machine, in which a high sensitivity sensor for precisely measuring the amplitude of a discharge signal and a plurality of array sensors disposed at regular intervals are integrated as one body, thus measuring the position of an internal defect while detecting a discharge signal. Moreover, the ultra-high frequency partial discharge array sensor apparatus for a high-voltage power apparatus of the invention can eliminate the inconvenience of using a plurality of sensors which are to be installed on a housing of the high-voltage power apparatus to measuring a discharge position while detecting a partial discharge generated due to the internal defect and increase the accuracy of measuring the position of the internal defect by providing accurate coordinates of individual sensors.

2. Discussion of Related Art

An ultra-high frequency partial discharge sensor is usually used to detect an electromagnetic wave partial discharge signal generated due to an internal defect of a high-voltage power apparatus such as a gas insulated switchgear, a power transformer, a reactor, or a high-voltage rotating machine.

The ultra-high frequency partial discharge sensor has a structure in which a signal detected by one sensing unit with one sensor is transmitted to a measurement apparatus through a connector. In order to estimate the position where an electromagnetic wave partial discharge signal is generated in the high-voltage power apparatus using the ultra-high frequency partial discharge sensor having the above-described structure, at least two or three ultra-high frequency partial discharge sensors of the same type have to be installed. In particular, in order to measure the position where a partial discharge signal is generated in a reactor or a transformer with a three-dimensional structure, it is necessary to install three or four ultra-high frequency partial discharge sensors having the same structure and characteristic on a housing of the power apparatus.

After installing a plurality of ultra-high frequency partial discharge sensors on the housing of the power apparatus, the position where the partial discharge signal is generated is measured by a method such as time difference of arrival (TDOA).

However, when the plurality of ultra-high frequency partial discharge sensors are installed on the housing of the power apparatus, there is a problem in that relatively high cost and effort are required.

Further, in order to measure the positions using TDOA, it is necessary to simultaneously measure the accurate positions where the ultra-high frequency partial discharge sensors are installed. Therefore, there is a problem in that as the number of the ultra-high frequency partial discharge sensors increases, the errors in measuring the sensor positions increase, and thus computation errors also increase when computing the position of the internal discharge of the power apparatus.

Further, when the ultra-high frequency partial discharge sensors are installed in several locations, bending and length of signal connection lines increase, and thus many errors occur during arrival time measurement. Therefore, there is a problem in that the errors increase during position measurement using a signal arrival time.

As another technique for measuring the position where the partial discharge signal is generated in the power apparatus, a narrow band sensor in which a detection frequency band of the ultra-high frequency partial discharge sensor is narrow is used. In this case, since a signal corresponding to a detection band of the sensor is neither generated nor transmitted depending on the type of a discharge generated in the power apparatus or the position of an internal structure, it is difficult to detect the signal. Further, since a rising time of a detected signal is not fast, it is not easy to accurately measure a signal arrival time, and thus it is difficult to use the narrow band sensor to measure the internal position of the defect in the power apparatus.

SUMMARY OF THE INVENTION

The present invention is directed to an ultra-high frequency partial discharge array sensor apparatus for detecting an electromagnetic wave partial discharge signal generated due to an internal defect of a high-voltage power apparatus such as a gas insulated switchgear, a power transformer, a reactor, or a high voltage rotating machine, in which a high sensitivity sensor for precisely measuring the amplitude of a discharge signal and a plurality of array sensors disposed at regular intervals are integrated as one body, thus measuring a position of an internal defect while detecting a discharge signal.

The present invention is also directed to an ultra-high frequency partial discharge array sensor apparatus for a high-voltage power apparatus, which can eliminate the inconvenience of using a plurality of sensors which are to be installed on a housing of the high-voltage apparatus to measure a discharge position while detecting a partial discharge generated due to the internal defect and up the accuracy of measuring the position of the internal defect by providing accurate coordinates of individual sensors.

According to an aspect of the present invention, there is provided an ultra-high frequency partial discharge array sensor apparatus for a high-voltage power apparatus, including: a sensing unit which detects an electromagnetic wave partial discharge signal generated due to an internal defect of a high-voltage power apparatus and includes a plurality of sensors installed to detect information related to the position where the defect occurs; an anti-surge filter unit which prevents a surge input from the sensing unit; a signal delay time adjusting unit which equally adjusts delay times of signals input from the anti-surge filter unit; a signal switching unit which selectively transmits or blocks signals input from the signal delay time adjusting unit; a connector unit which connects a signal transmitted from the signal switching unit to the outside; and a sensor body which has a receiving space.

The sensing unit may include a high sensitivity sensor disposed at a center thereof and a plurality of array sensors for position estimation disposed at regular intervals around the high sensitivity sensor.

The anti-surge filter unit may include: a high sensitivity anti-surge filter connected to the high sensitivity sensor and a plurality of array anti-surge filters connected to the array sensors, respectively.

The signal delay time adjusting unit may be configured with electric wires, signal lines, or signal lines of a circuit substrate and may adjust the length of signal lines connected from the sensing unit to the signal switching unit to make the time taken for signals detected by the respective sensors of the sensing unit to reach the connector unit equal to each other.

The signal delay time adjusting unit may be configured with electric wires, signal lines, or signal lines of a circuit substrate and may change the material of the signal lines to change the velocity of signal transmission.

The signal switching unit may be configured with a switching element including a semiconductor switch or a mechanical latch relay switch and may relay signals detected by the sensing unit to the connector unit or switch signals of the array sensors around the high sensitivity sensor to be output to a high sensitivity connector of the connector unit together with a central sensor signal, thus increasing sensitivity. The connector unit may have a structure in which a high sensitivity connector, an array sensor connector, and a signal switch connector which receives a switching command from the signal switching unit are installed outside the sensor body.

The sensor body may have a hermetically sealed structure in which a dielectric material for fixing sensors is filled therein, the connector unit is installed on the outside thereof, and a flange having bolt holes through which the sensor body is attached to a housing of a power apparatus is formed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
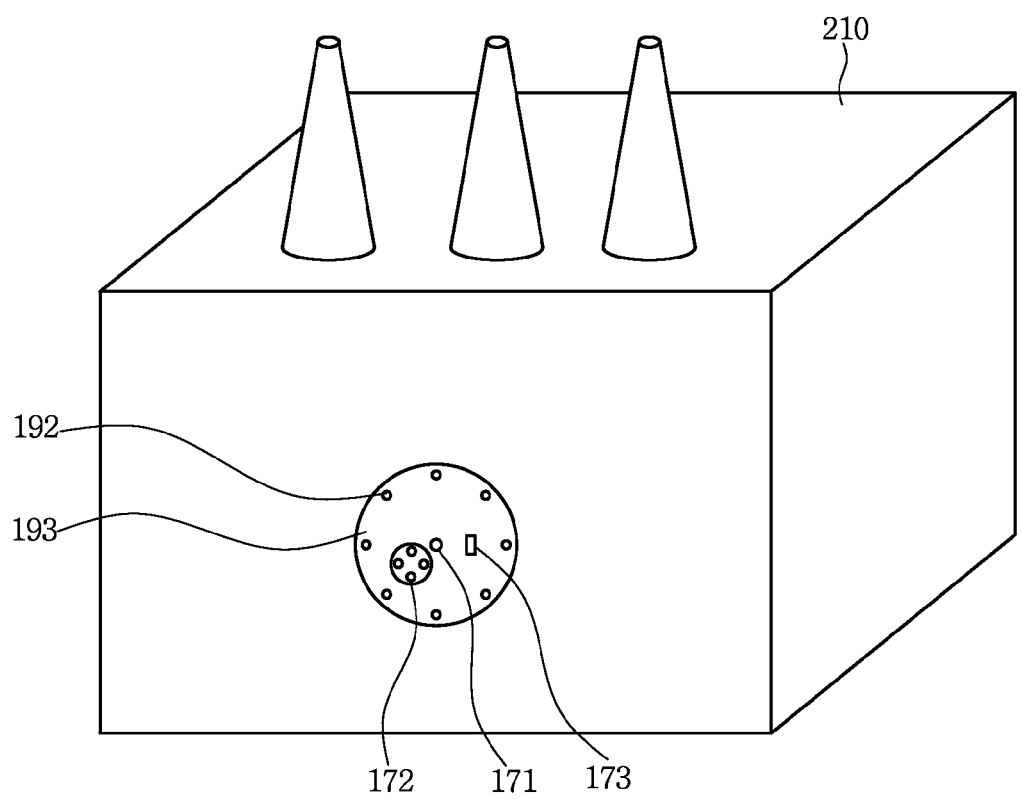
FIG. 1 is a perspective view illustrating a state in which an ultra-high frequency partial discharge array sensor apparatus for a high-voltage power apparatus according to an exemplary embodiment of the present invention is installed in a high-voltage power apparatus.
Figure 2:
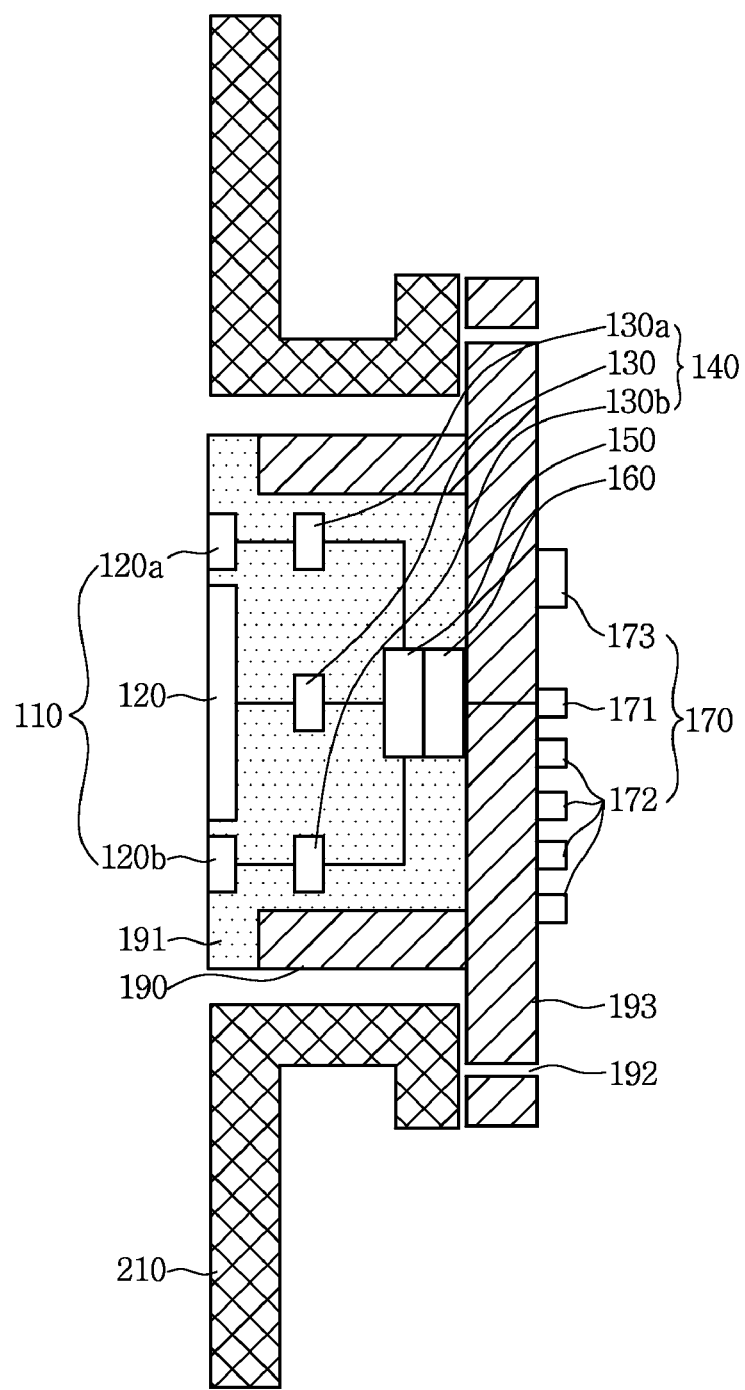
FIG. 2 is a cross-sectional view of an ultra-high frequency partial discharge array sensor apparatus for a high-voltage power apparatus according to an exemplary embodiment of the present invention.
Figure 3:
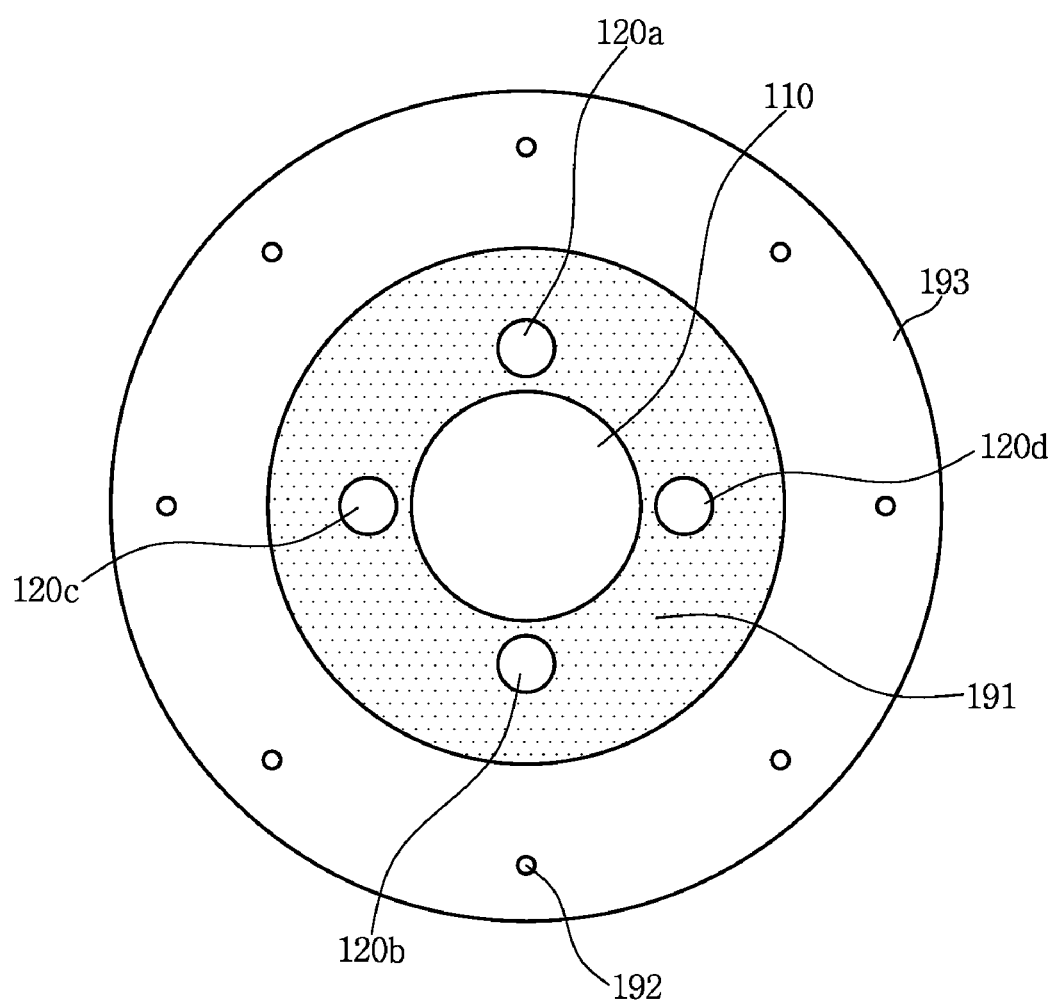
FIG. 3 is a rear view of an ultra-high frequency partial discharge array sensor apparatus for a high-voltage power apparatus according to an exemplary embodiment of the present invention.
Figure 4:
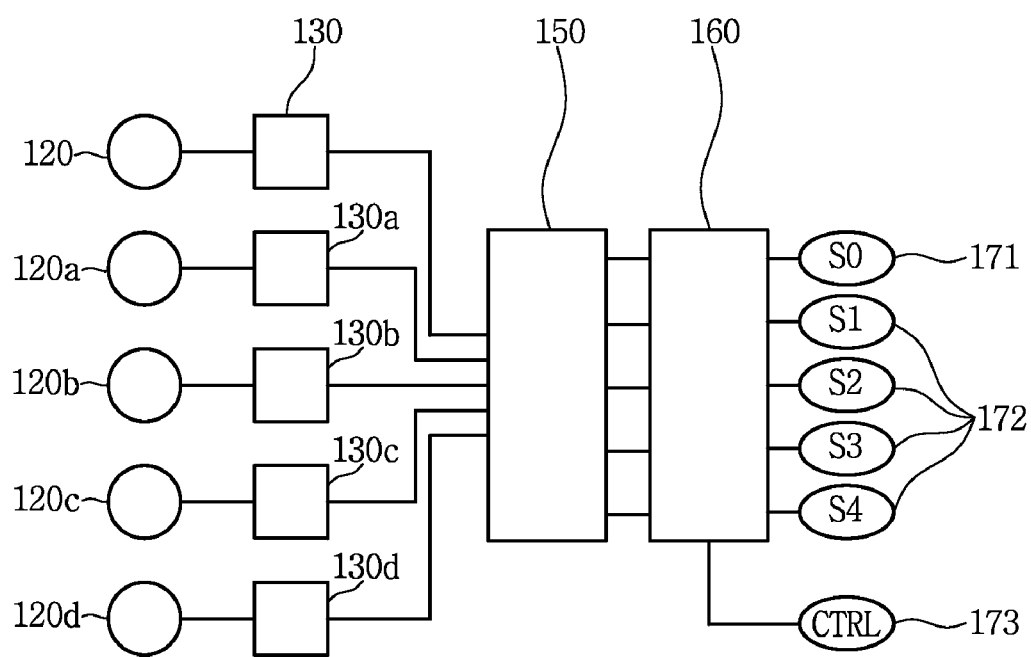
FIG. 4 is a circuit diagram of an ultra-high frequency partial discharge array sensor apparatus for a high-voltage power apparatus according to an exemplary embodiment of the present invention.

FIG. 1 is a perspective view illustrating a state in which an ultra-high frequency partial discharge array sensor apparatus for a high-voltage power apparatus according to an exemplary embodiment of the present invention is installed in a high-voltage power apparatus. FIG. 2 is a cross-sectional view of an ultra-high frequency partial discharge array sensor apparatus for a high-voltage power apparatus according to an exemplary embodiment of the present invention. FIG. 3 is a rear view of an ultra-high frequency partial discharge array sensor apparatus for a high-voltage power apparatus according to an exemplary embodiment of the present invention. FIG. 4 is a circuit diagram of an ultra-high frequency partial discharge array sensor apparatus for a high-voltage power apparatus according to an exemplary embodiment of the present invention.

As illustrated in FIGS. 1 to 4, an ultra-high frequency partial discharge array sensor apparatus for a high-voltage power apparatus according to an exemplary embodiment of the present invention includes a sensing unit 110 which detects an electromagnetic wave partial discharge signal generated due to an internal defect of a high-voltage power apparatus and includes a plurality of sensors for detecting information related to the position where the defect occurs, an anti-surge filter unit 140 for which prevents a surge input from the sensing unit 110, a signal delay time adjusting unit 150 which equally adjusts delay times of signals input from the anti-surge filter unit 140, a signal switching unit 160 which selectively transmits or blocks signals input from the signal delay time adjusting unit 150, a connector unit 170 which connects signals transmitted through the signal switching unit 160 to the outside, and a sensor body 190 which has a receiving space therein.

The sensing unit 110 includes a high sensitivity sensor 120 disposed at a center thereof and position estimation array sensors 120a to 120d which are disposed at regular intervals around the high sensitivity sensor 120.

The anti-surge filter unit 140 includes a high sensitivity anti-surge filter 130 connected to the high sensitivity sensor 120 and array anti-surge filters 130a to 130d connected to the array sensors 120a to 120d, respectively.

The signal delay time adjusting unit 150 is configured with electric wires, signal lines, or signal lines of a circuit substrate. The signal delay time adjusting unit 150 adjusts the length of signal lines connected from the sensing unit 110 to the signal switching unit 160 to make the times taken for signals detected by the sensors of the sensing unit 110 to reach the connector unit 170 equal to each other or changes the material of the signal lines to change the transmission rate of the signal route. The length or the material of the signal lines is set to an optimum value through an experiment.

The signal switching unit 160 is configured with a switching element such as a semiconductor switch or a mechanical latch relay switch. The signal switching unit 160 relays signals detected by the sensing unit 110 to the connector unit 170 or switches signals of the array sensors 120a to 120d around the high sensitivity sensor 120 to be output to a high sensitivity connector 171 of the connector unit 170 together with a central sensor signal, thus increasing the sensitivity. The semiconductor switch or the mechanical latch relay switch as the switching element may receive an electric signal from a signal switch connector 173 to be switched or be maintained in a switched state.

The connector unit 170 may have a hermetically sealed structure in which the high sensitivity connector 171, an array sensor connector 172, and the signal switch connector 173 which receives a switching command from the signal switching unit 160 are installed outside the sensor body 190.

The sensor body 190 may have a structure in which a dielectric material 191 for fixing sensors is filled, the connector unit 170 is installed on its outside, and a flange 193 having bolt holes 192 through which the sensor body 190 is attached to a housing 210 of the power apparatus is formed.

Next, operation of the ultra-high frequency partial discharge array sensor apparatus for the high-voltage power apparatus according to an exemplary embodiment of the present invention will be described.

When the array sensor apparatus is installed to detect an electromagnetic wave partial discharge signal generated due to an internal defect of the high-voltage power apparatus 210 such as a gas insulated switchgear, a power transformer, a reactor, or a high voltage rotating machine, the signals detected by the sensing unit 110 of the array sensor apparatus, that is, the signals detected by the sensors 120 and 120a to 120d, are input to the delay time adjusting unit 150 through the anti-surge filter unit 140.

The delay time adjusting unit 150 delays the signals from the sensors 120 and 120a to 120d to have a constant transmission time, and an output of the delay time adjusting unit 150 is transmitted to the high sensitivity connector 171 and the array sensor connector 172 of the connector unit 170 which are disposed on a sensor housing through the signal switching unit 160.

Therefore, since the signals of the sensors 120 and 120a to 120d disposed at regular intervals on the array sensor apparatus having the sensor body 190 are output, it is possible to eliminate the inconvenience of using a plurality of sensors. Since the array sensors are attached to the sensor body 190 at regular intervals, it is possible to reduce the errors occurring during the measurement of discharge positions by providing accurate sensor coordinates.

Since the delay times of signals detected by the respective sensors of the sensing unit 110 are adjusted and output by the signal delay time adjusting unit 150 installed in the sensor body 190, the signals detected by the respective sensors and measured by the connector unit 170 installed on the sensor housing have the same delay time. Further, it is possible to check the delay times and the states of the sensors when a signal is applied the input of the high sensitivity sensing unit 120 at the center through connector 171 thereof and detected by the respective sensors.

Outputs which have been connected to the respective connectors of the connector unit 170 may be connected to an output of the high sensitivity sensing unit 120 through the switching operation of the signal switching unit 160 installed in the sensor body 190 such that the relative detection area of the sensor increases, thus increasing the sensitivity. A sensor which is not in use may be grounded to adjust the sensitivity and detection band by changing state of the signal switching unit 160.

When the array sensor apparatus of the present invention is installed in the high-voltage power apparatus such as a transformer or a reactor to detect a partial discharge signal, the array sensor apparatus may be used to detect a partial discharge signal generated in the power apparatus using a position estimation method such as TDOA by detecting the signals from the four independent array sensors 120a to 120d which are disposed at regular intervals.

According to the present invention, since the high sensitivity sensing unit 120 which can accurately measure the amplitude of a discharge signal and the array sensors 120a to 120d for precise position estimation are installed in one sensor body 190, one array sensor apparatus can be installed in the power apparatus and used for partial discharge measurement and position estimation. Therefore, it is possible to eliminate the inconvenience of using a plurality of array sensors and reduce the installing cost and effort.

The array sensor apparatus of the present invention may be applied to partial discharge defect diagnosis of a high-voltage power apparatus having a three-dimensional structure such as a transformer and may be used for defect diagnosis and discharge position estimation of a reactor or a power structure as well as an oil-immersed transformer.

As described above, the ultra-high frequency partial discharge array sensor apparatus for detecting an electromagnetic wave partial discharge signal generated due to an internal defect of a high-voltage power apparatus such as a gas insulated switchgear, a power transformer, a reactor, or a high voltage rotating machine according to the present invention has the following effects. Since the high sensitivity sensor for precisely measuring the amplitude of a discharge signal and the plurality of array sensors disposed at regular intervals are integrated as one body, it is possible to measure the position of an internal defect while detecting a discharge signal. Moreover, the ultra-high frequency partial discharge array sensor apparatus for a high-voltage power apparatus of the invention can eliminate the inconvenience of using a plurality of sensors which are to be installed on a housing of the high-voltage power apparatus to measure a discharge position while detecting a partial discharge generated due to the internal defect and increase the accuracy of measuring the position of the internal defect by providing accurate coordinates of individual sensors.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. An ultra-high frequency partial discharge array sensor apparatus for a high-voltage power apparatus, comprising:
   a sensing unit which detects an electromagnetic wave partial discharge signal generated due to an internal defect of a high-voltage power apparatus and includes a plurality of sensors installed to detect information related to the position where the defect occurs;
   an anti-surge filter unit which prevents a surge input from the sensing unit;
   a signal delay time adjusting unit which equally adjusts delay times of signals input from the anti-surge filter unit;
   a signal switching unit which selectively transmits or blocks signals input from the signal delay time adjusting unit;
   a connector unit which connects a signal transmitted from the signal switching unit to the outside; and
   a sensor body which has a receiving space,
   wherein the sensing unit comprises a high sensitivity sensor disposed at a center thereof and a plurality of array sensors for position estimation disposed at regular intervals around the high sensitivity sensor,
   wherein the connector unit has a hermetically sealed structure in which a high sensitivity connector, an array sensor connector, and a signal switch connector which receives a switching command from the signal switching unit are installed outside the sensor body.

2. The ultra-high frequency partial discharge array sensor apparatus of claim 1, wherein the sensor body has a structure in which a dielectric material for fixing sensors is filled therein, the connector unit is installed on the outside thereof, and a flange having bolt holes through which the sensor body is attached to a housing of the power apparatus is formed.

3. The ultra-high frequency partial discharge array sensor apparatus of claim 1, wherein the anti-surge filter unit comprises: a high sensitivity anti-surge filter connected to the high sensitivity sensor and a plurality of array anti-surge filters connected to the array sensors, respectively.

4. The ultra-high frequency partial discharge array sensor apparatus of claim 1, wherein the signal delay time adjusting unit is configured with electric wires, signal lines, or signal lines of a circuit substrate and adjusts the length of signal lines connected from the sensing unit to the signal switching unit to make the times taken for signals detected by the respective sensors of the sensing unit to reach the connector unit equal to each other.

5. The ultra-high frequency partial discharge array sensor apparatus of claim 1, wherein the signal delay time adjusting unit is configured with electric wires, signal lines, or signal lines of a circuit substrate and changes the material of the signal lines to change the transmission rate of the signal.

6. The ultra-high frequency partial discharge array sensor apparatus of claim 1, wherein the signal switching unit is configured with a switching element including a semiconductor switch or a mechanical latch relay switch and relays signals detected by the sensing unit to the connector unit or switches signals of the array sensors around the high sensitivity sensor to the output to a high sensitivity connector of the connector unit together with a central sensor signal, thus increasing sensitivity.

7. An ultra-high frequency partial discharge array sensor apparatus for a high-voltage power apparatus, comprising:
   a sensing unit which detects an electromagnetic wave partial discharge signal generated due to an internal defect of a high-voltage power apparatus and includes a plurality of sensors installed to detect information related to the position where the defect occurs;
   an anti-surge filter unit which prevents a surge input from the sensing unit;
   a signal delay time adjusting unit which equally adjusts delay times of signals input from the anti-surge filter unit;
   a signal switching unit which selectively transmits or blocks signals input from the signal delay time adjusting unit;
   a connector unit which connects a signal transmitted from the signal switching unit to the outside; and
   a sensor body which has a receiving space,
   wherein the connector unit has a hermetically sealed structure in which a high sensitivity connector, an array sensor connector, and a signal switch connector which receives a switching command from the signal switching unit are installed outside the sensor body.

8. An ultra-high frequency partial discharge array sensor apparatus for a high-voltage power apparatus, comprising:
   a sensing unit which detects an electromagnetic wave partial discharge signal generated due to an internal defect of a high-voltage power apparatus and includes a plurality of sensors installed to detect information related to the position where the defect occurs;
   an anti-surge filter unit which prevents a surge input from the sensing unit;
   a signal delay time adjusting unit which equally adjusts delay times of signals input from the anti-surge filter unit;
   a signal switching unit which selectively transmits or blocks signals input from the signal delay time adjusting unit; a connector unit which connects a signal transmitted from the signal switching unit to the outside; and
   a sensor body which has a receiving space,
   wherein the sensor body has a structure in which a dielectric material for fixing sensors is filled therein, the connector unit is installed on the outside thereof, and a flange having bolt holes through which the sensor body is attached to a housing of the power apparatus is formed.

* * * * *